(12) United States Patent
Lee et al.

(10) Patent No.: US 8,506,123 B2
(45) Date of Patent: Aug. 13, 2013

(54) LED FLASH LENS UNIT AND MANUFACTURING METHOD THEREOF

(75) Inventors: Jin Eui Lee, Seongnam-si (KR); Seung Jae Lee, Seoul (KR); Dong Seob Jang, Seoul (KR); Heung Bom Kim, Suwon-si (KR); Jin Bae Kim, Suwon-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 48 days.

(21) Appl. No.: 13/338,874

(22) Filed: Dec. 28, 2011

(65) Prior Publication Data

US 2012/0182710 A1 Jul. 19, 2012

(30) Foreign Application Priority Data

Jan. 14, 2011 (KR) ........................ 10-2011-0004068

(51) Int. Cl.
 *F21V 5/04* (2006.01)
(52) U.S. Cl.
 USPC .................. 362/268; 362/296.01; 362/311.02
(58) Field of Classification Search
 USPC ................................ 362/268, 296.01, 311.02
 See application file for complete search history.

(56) References Cited

U.S. PATENT DOCUMENTS

| | | | |
|---|---|---|---|
| 2005/0093430 | A1 | 5/2005 | Ibbetson et al. |
| 2009/0173958 | A1 | 7/2009 | Chakraborty et al. |
| 2009/0272990 | A1 | 11/2009 | Sun et al. |
| 2010/0270907 | A1 | 10/2010 | Yamaguchi et al. |
| 2010/0321952 | A1 | 12/2010 | Coleman et al. |
| 2011/0085330 | A1* | 4/2011 | Pudleiner et al. ............. 362/235 |

FOREIGN PATENT DOCUMENTS

| | | |
|---|---|---|
| DE | 10-2009-017946 | 10/2010 |
| KR | 10-2009-0071532 | 7/2009 |
| KR | 10-2009-0128103 | 12/2009 |
| KR | 10-2010-0068584 | 6/2010 |

OTHER PUBLICATIONS

Partial European Search Report dated Jul. 11, 2012 issued in corresponding European Patent Application No. 11194383.3.

\* cited by examiner

*Primary Examiner* — David V Bruce
(74) *Attorney, Agent, or Firm* — Staas & Halsey LLP

(57) ABSTRACT

Disclosed herein is an LED flash lens unit which prevents occurrence of yellow bands or yellow rings if LED light is concentrated through an LED flash lens improving manufacturing ability and mass production to have high performance and high efficiency.

13 Claims, 9 Drawing Sheets

LED FLASH LENS UNIT AND MANUFACTURING METHOD THEREOF

CROSS-REFERENCE TO RELATED APPLICATIONS

This application claims the benefit of Korean Patent Application No. 2011-0004068, filed on Jan. 14, 2011 in the Korean Intellectual Property Office, the disclosure of which is incorporated herein by reference.

BACKGROUND

1. Field

Embodiments of the present invention relate to an LED flash lens which is mounted on a photographing apparatus, such as a camera, used as a subsidiary light source of the photographing apparatus during photographing, and allows LED light to be concentrated on a photographing region so as to enable high quality of photographing to be carried out.

2. Description of the Related Art

In general, xenon lamps and LEDs have been mainly used as light sources of flashes. A xenon stroboscope of a xenon lamp may emit sufficiently bright light but has a large volume of other parts except for a light emitting part, thus being mainly used in a large-size digital camera. On the other hand, an LED stroboscope of an LED flash may be miniaturized but does not have sufficient brightness. Therefore, the LED flash requires high light concentration, and thus if light concentration is required, a condensing lens may be installed to improve light concentration.

Further, in order to intactly display the inherent colors of an object with a flash using LEDs assisting a photographing apparatus, the flash needs to emit white light the most similar to natural light.

In order to form white light using LEDs, there is a method of forming white light by mixing three primary colors of light, i.e., red, green and blue. However, this method is not easy to be substantially implemented, particularly in the case of the LED flash requiring light concentration. Therefore, a method of forming white light by using blue chips as LEDs and applying a phosphor to the blue chips has been most universally used.

However, in the case of such a technique of forming white light by applying the phosphor to the blue chips, yellow bands or yellow rings having concentric shapes occur. When the yellow bands or the yellow rings occur, white light decreases in value.

It is recognized that occurrence of the yellow bands or the yellow rings in the LED flash field in which the phosphor is applied to the blue LED is the most important problem to be solved.

SUMMARY

Therefore, it is an aspect of the present invention to provide an LED flash lens unit which prevents occurrence of yellow bands or yellow rings if LED light is concentrated through an LED flash lens improving manufacturing ability and mass production to have high performance and high efficiency.

Additional aspects of the invention will be set forth in part in the description which follows and, in part, will be obvious from the description, or may be learned by practice of the invention.

In accordance with one aspect of the embodiment, an LED flash lens unit to concentrate LED light emitted from an LED includes a first lens surface including reflective portions to reflect the LED light if the angle of the LED light passing through the front end of the LED is more than a designated angle, and a transmissive portion to transmit the LED light if the angle of the LED light is not more than the designated angle, a second lens surface to concentrate the LED light reflected or transmitted by the first lens surface, a beam scatter device located at the transmissive portion of the first lens surface and provided with at least one form having a designated peak and a designated valley to scatter yellow light from among the LED light, and a lens support part connecting the first lens surface and the second lens surface to each other and maintaining a designated distance with the LED.

The designated angle may be about 140 degrees.

The second lens surface may refract the LED light, reflected or transmitted by the first lens surface to concentrate the LED light.

The beam scatter may be configured such that the at least one form having the designated peak and valley is periodically or aperiodically arranged.

The first lens surface may be formed according to a radius and a conic coefficient of the first lens surface, a central thickness of the lens unit, and a depth and a radius of the transmissive portion of the first lens surface.

The second lens surface may be formed according to a radius and a conic coefficient of the second lens surface and the central thickness of the lens unit.

The first lens surface or the second lens surface may have an aspheric shape.

In accordance with another aspect of the embodiment, a manufacturing method of an LED flash lens unit to concentrate LED light emitted from an LED includes installing an upper core surrounding the LED flash lens unit on the LED flash lens unit, installing a corrosion core, to form a designated beam scatter device scattering yellow light on the lower lens surface of the LED flash lens unit, corresponding to the lower lens surface of the LED flash lens unit, installing a lower core in a space formed between the LED flash lens unit and the corrosion core, and injecting a lens forming material into the LED flash lens unit and then molding the LED flash lens unit.

The manufacturing method may further include separating the corrosion core and the lower core from each other by at a designated clearance so as to exhaust air generated when the LED flash lens unit is formed by injection molding.

The manufacturing method may further include ejecting the molded LED flash lens unit by pushing the molded LED flash lens unit by the corrosion core.

The installation of the corrosion core may include installing the corrosion core, to form the designated beam scatter device scattering yellow light on the lower lens surface of the LED flash lens unit by physical corrosion, chemical corrosion or sand blasting, corresponding to the lower lens surface of the LED flash lent unit.

BRIEF DESCRIPTION OF THE DRAWINGS

These and/or other aspects of the invention will become apparent and more readily appreciated from the following description of the embodiments, taken in conjunction with the accompanying drawings of which.

DETAILED DESCRIPTION

Figure 1:
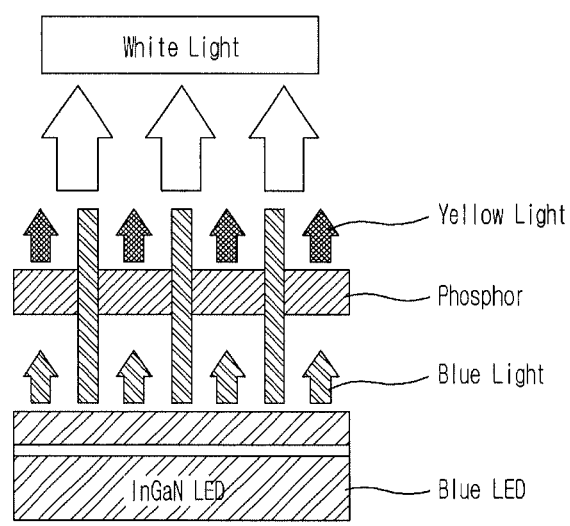
FIG. 1 is a view illustrating the concept of a technique of applying a phosphor to a general blue LED to form white light.

Reference will now be made in detail to the embodiments, examples of which are illustrated in the accompanying drawings, wherein like reference numerals refer to like elements throughout.

FIG. 1 is a view illustrating the concept of a technique of applying a phosphor to a general blue LED to form white light.

As shown in FIG. 1, white light may be formed by applying the phosphor to the SMD-type blue LED. The blue InGaN LED is attached to a PCB, and a LED light emitting region of the InGaN LED is coated with the phosphor. The wavelength of blue light emitted from the InGaN LED is changed by the phosphor, and thus the blue light is changed into white light. If a lens to concentrate light is provided on the LED having such a structure, the lens concentrates and irradiates yellow light of the phosphor, and thus yellow bands or yellow rings occur. Due to such a phenomenon, an obtained photograph does not have the inherent color sense of a subject for photography.

Figure 2:
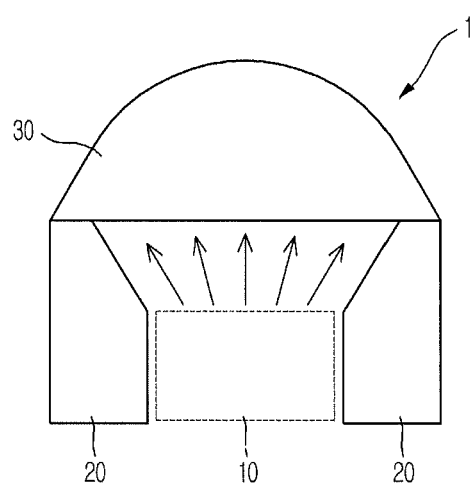
FIG. 2 is a longitudinal-sectional view illustrating a conventional LED flash lens unit.

FIG. 2 is a longitudinal-sectional view illustrating a conventional LED flash lens unit.

A conventional LED flash lens unit 1 is a module including reflectors 20 having reflective planes and a lens 30, connected to each other. The reflectors 20 serves to transmit light emitted at a large angle of 100 degrees or more forwards through the reflective planes. This collects a larger amount of light and thus improves efficiency and an angle of view.

Figure 3:
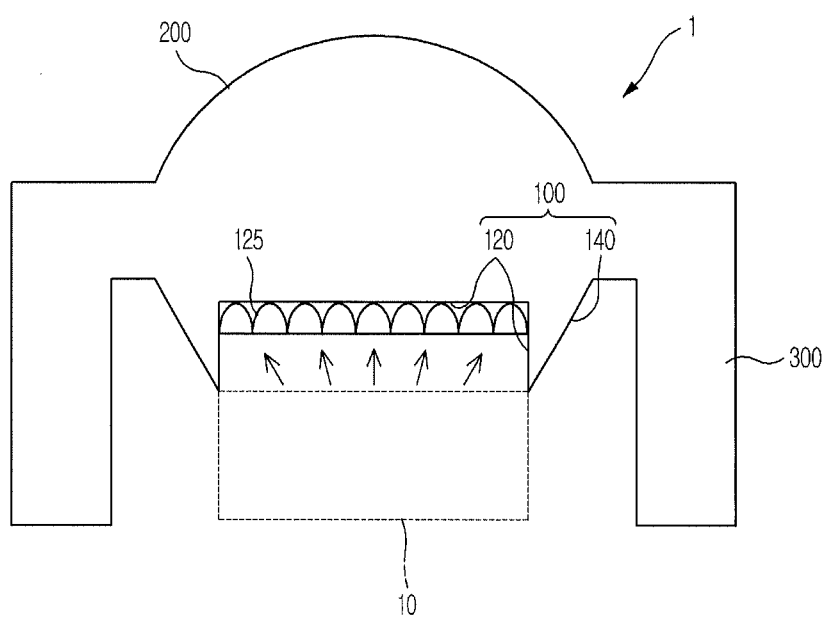
FIG. 3 is a longitudinal-sectional view illustrating an LED flash lens unit in accordance with one embodiment.

FIG. 3 is a longitudinal-sectional view illustrating an LED flash lens unit in accordance with one embodiment.

An LED flash lens unit 1 in accordance with the embodiment of the present invention includes a first lens surface 100, a second lens surface 200, a lens support part 300 and a beam scatter device 125, so as to concentrate light of an LED 10.

The first lens surface 100 primarily concentrates light emitted from the LED 10, and may include a transmissive plane 120 and reflective planes 140. The first lens surface 100 is configured such that the reflective planes 140 are located at both sides of the transmissive plane 120.

The reflective planes 140 reflect the light of the LED 10 if an angle of the light passing through the front end of the LED 10 is more than a designated angle. The transmissive plane 120 transmits the light of the LED 10 if the angle of the light is not more than the designated angle.

Here, the designated angle is an angle to effectively concentrate the light of the LED 10. For example, the designated angle may be 40 degrees. That is, if the angle of the light of the LED 10 passing through the front end of the LED 10 is more than about 140 degrees with the front end plane of the LED 10, the light of the LED 10 is reflected by the reflective planes 140, and if the angle of the light of the LED 10 passing through the front end of the LED 10 is not more than about 140 degrees with front end plane of the LED 10, the light of the LED 10 is transmitted by the transmissive plane 120.

The beam scatter device 125 is installed on the transmissive plane 120 of the first lens surface 100. The beam scatter device 125 is installed on the transmissive plane 120 to prevent occurrence of yellow bands or yellow ring when light emitted from the LED 10 is concentrated by a lens.

The beam scatter device 125 is configured such that forms having a designated peak and a designated valley are arranged in one cycle. The form having the designated peak and valley may have various longitudinal-sectional shapes, such as a circle and a rectangle, and may be obtained only if a height from the peak to the valley is maintained within a designated range.

Further, the beam scatter device 125 may be configured such that the forms may be periodically or aperiodically arranged within a designated range. The respective forms may be arranged by a designated interval. For example, the designated interval may have a value of 0.001 mm~0.1 min, and the height from the peak to the valley of the beam scatter device 125 may have a value of 0.001 mm~0.1 mm.

Figure 4:
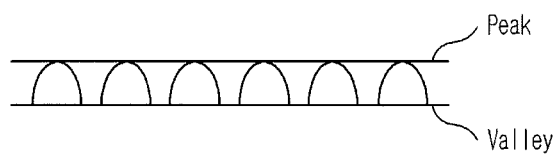
FIG. 4 is a longitudinal-sectional view illustrating a beam scatter device formed in the LED flash lens unit in accordance with the embodiment.

FIG. 4 is a longitudinal-sectional view illustrating the beam scatter device 125 of the LED flash lens unit 1 in accordance with the embodiment of the present invention. Although FIG. 4 illustrates the beam scatter device 125 in which semicircular forms are arranged between a peak value and a valley value, forms having any shape may be arranged between a designated peak value and a designated valley value.

Figure 5:
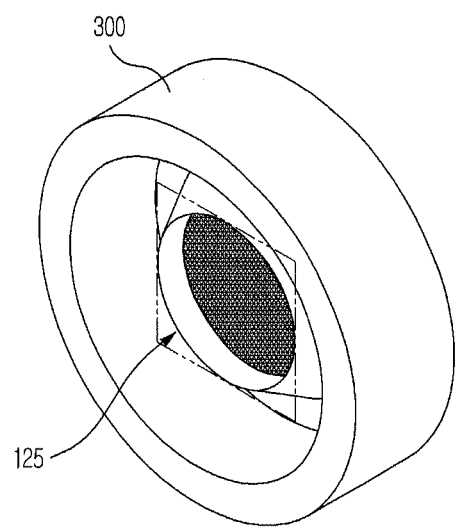
FIG. 5 is a perspective view illustrating one shape of the beam scatter device formed in the LED flash lens unit in accordance with the embodiment.
Figure 6:
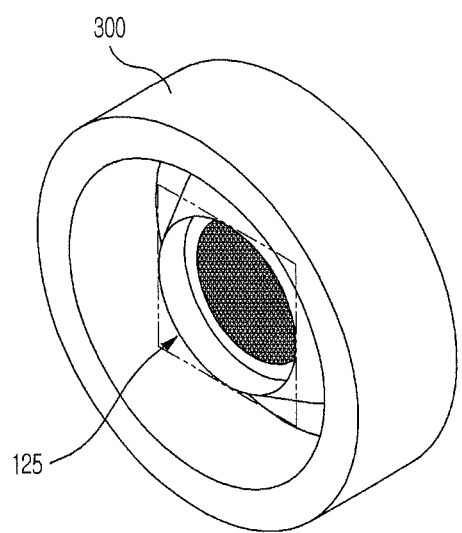
FIG. 6 is a perspective view illustrating another shape of the beam scatter device formed in the LED flash lens unit in accordance with the embodiment.
Figure 7:
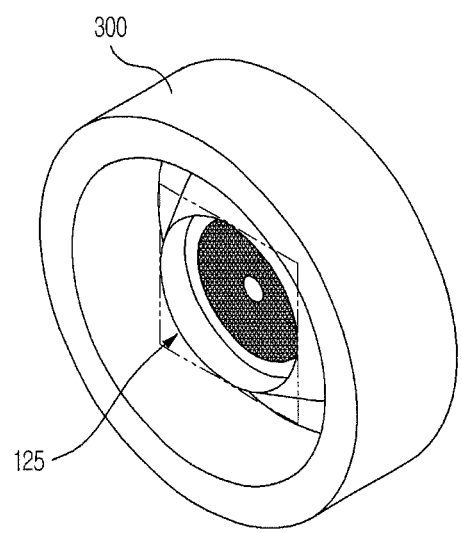
FIG. 7 is a perspective view illustrating a further shape of the beam scatter device formed in the LED flash lens unit in accordance with the embodiment.

Further, FIGS. 5 to 7 are perspective views illustrating various shapes of the beam scatter device 125. That is, the shapes of the beam scatter device 125 shown in FIGS. 5 to 7 are seen from the lower end of the LED flash lens unit 1.

FIG. 5 exemplarily illustrates the beam scatter device 125 which is installed only on the transmissive plane 120 of the first lens surface 100. Further, FIG. 6 exemplarily illustrates the beam scatter device 125 which is installed only at a designated portion of the transmissive plane 120 of the first lens surface 100, and FIG. 7 exemplarily illustrates the beam scatter device 125 in a band shape (ring-shaped) which is installed at a designated portion of the transmissive plane 120 of the first lens surface 100.

The second lens surface 200 concentrates the light of the LED 10 reflected or transmitted by the first lens surface 100. The second lens surface 200 refracts the light of the LED 10 incident thereon, thus concentrating the light of the LED 10.

The lens support part 300 connects the first lens surface 100 and the second lens surface 200 to each other, maintains a distance between the LED flash lens unit 1 and the LED 10, and fixes the LED flash lens unit 1 to a PCB. The shape of the lens support part 300 may be properly modified according to the shape of the LED 10 or a light concentration structure.

Based on the above-described structure of the LED flash lens unit 1, a process of concentrating the light of the LED 10 through the LED flash lens unit 1 without occurrence of yellow bands or yellow rings will be exemplarily described, as follows.

Light of the LED 10 which is emitted from the LED 10 reaches the first lens surface 100. From among the light of the LED 10, light beams emitted at an angle being not more than about 140 degrees are transmitted by the transmissive plane 120 of the first lens surface 100, and light beams emitted at an angle being more than 140 degrees are reflected by the reflective planes 140 of the first lens surface 100 and travels straight at an angle being not more than 10 degrees.

The reflective planes 140 reflect the light beams through total reflection without any separate reflective coating. Total reflection may be described using Equation below.

$$n \sin \theta = n' \sin \theta'$$

Here, n represents a refractive index of a medium, n' represents a refractive index of air, θ represents an incident angle, and θ' represents a refraction angle.

In above Equation, an incident angle on a medium having a refraction angle θ' of 90 degrees is referred to as a critical angle. All light beams of the LED 10 incident at an angle larger than the critical angle are reflected. The lens in accordance with the embodiment of the present invention is made of Zeonex-E48R and has a refractive index of 1.531. The critical angle of 40.8 degrees is calculated through above Equation. Therefore, when the light beams of the LED 10 emitted at the angle being more than 140 degrees are incident on the reflective planes 140, the angle of the light beams becomes more than 41 degrees and thus all of these light beams may be reflected. The reflected light beams of the LED 10 serve to increase light efficiency and an angle of view.

Further, the light beams of the LED 10 going straight at an angle being less than 140 degrees pass through the transmissive plane 120 of the first lens surface 100. At this time, the light beams pass through the beam scatter device 125 formed on the transmissive plane 120 to prevent occurrence of yellow bands or yellow rings, and the beam scatter device 125 scatters the light beams. Therefore, yellow light beams formed by the phosphor are scattered and thus are not irradiated onto an object.

The light beams of the LED 10 having passed through the first lens surface 100 pass through the optimum second lens surface 200 installed to achieve the maximum efficiency. Here, the second lens surface 200 may be formed through a lens design process in which the light beams of the LED 10 are concentrated on a designated region with a designated distance at a designated light intensity. The design process of the second lens surface 200 may be described, as follows.

In order to obtain the maximum efficiency in light concentration of the LED 10 through the second lens surface 200, an aspheric shape to transmit light beams emitted from respective positions of the LED 10 to a designated target position is optimized. An intensity of light of a flash is expressed by a guide number. The higher guide number means that the intensity of light is higher.

Table 1 below represents guide numbers calculated as a result of a simulation in which four LEDs 10 and four LED flash lens units in accordance with the embodiment of the present invention are used at a distance of 1 m.

TABLE 1

|  | Simulated value | Measured value |
|---|---|---|
| Guide number (GN) | 4.04 | 3.98 |

The simulated value or the measured value is close to the guide number 4 applicable to a flash for digital cameras, and it is shown that light beams may be concentrated at a sufficient intensity through the LED flash lens unit 1 in accordance with the embodiment of the present invention while eliminating yellow rings or yellow bands.

In relation to structures of the first lens surface 100 and the second lens surface 200, for example, when a photograph is taken using a camera, light needs to be irradiated onto a wide region so as to obtain a high-quality photograph even at a dark place. Therefore, it is important that the LED flash lens unit 1 in accordance with the embodiment of the present invention concentrates bright light and irradiates light more than a reference intensity upon a wide region, simultaneously.

In order to satisfy the above two requirements, the optimized structures of the first lens surface 100 and the second lens surface 200 may be determined by the radius of the first lens surface 100, the radius of the second lens surface 200, the conic coefficient of the first lens surface 100, the conic coefficient of the second lens surface 200, the central thickness of the lens, and the depth and radius of the transmissive portion of the first lens surface 100.

A conic plane may be defined by Equation below.

$$z = \frac{y^2\left(\frac{1}{r}\right)}{1 + \sqrt{1 - (1+k)y^2\left(\frac{1}{r}\right)^2}}$$

In above Equation, r is a radius, y is a height of the lens in the radial direction, and k is a conic coefficient.

For example, the shape of a lens to concentrate brightest light upon a target position away therefrom by a distance of 1 m and to obtain an angle of view (basically required during photographing using a photographing apparatus) of 60 degrees or more, simultaneously may depend on the optimum radius (r) of the lens, conic coefficient, central thickness (CT) of the lens, and depth (d) and radius (tr) of the transmissive plane 120 of the first lens surface 100, as follows.

$$0.8 > r1 > 0.5$$

$$-0.4 > k1 > -1.7$$

$$1.9 > r2 > 1.3$$

$$0.4 > k2 > -0.7$$

$$1.4 > CT > 0.95$$

$$0.5 > d > 0$$

$$0.85 > tr > 0.65$$

Here, r1 is the radius of the first lens surface 100, r2 is the radius of the second lens surface 200, k1 is the conic coefficient of the first lens surface 100, and k2 is the conic coefficient of the second lens surface 200.

Figure 8:
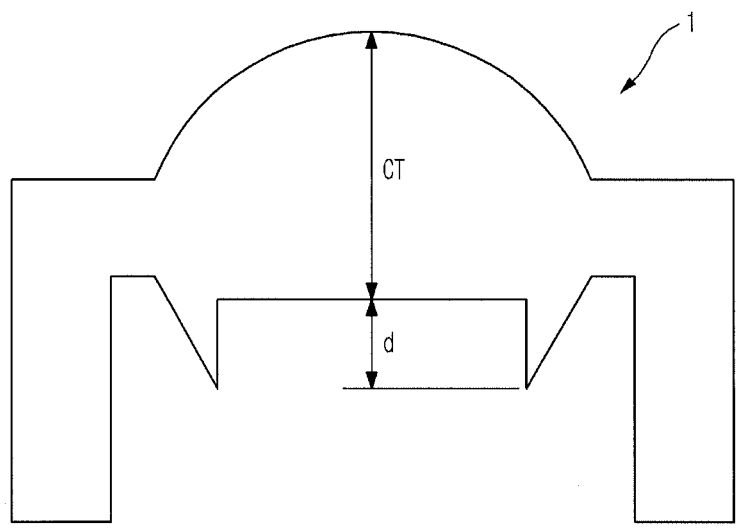
FIG. 8 is a longitudinal-sectional view illustrating a lens thickness and a depth of a transmissive portion of a first lens surface of the LED flash lens unit in accordance with the embodiment.

The central thickness (CT) of the lens and the depth and radius of the transmissive plane 120 of the first lens surface 100 are shown in FIG. 8. FIG. 8 is a longitudinal-sectional view illustrating the lens thickness and the depth of the transmissive portion of the first lens surface of the LED flash lens unit in accordance with the embodiment of the present invention.

Next, a manufacturing method of an LED flash lens unit in accordance with another embodiment of the present invention will be described.

Figure 9:
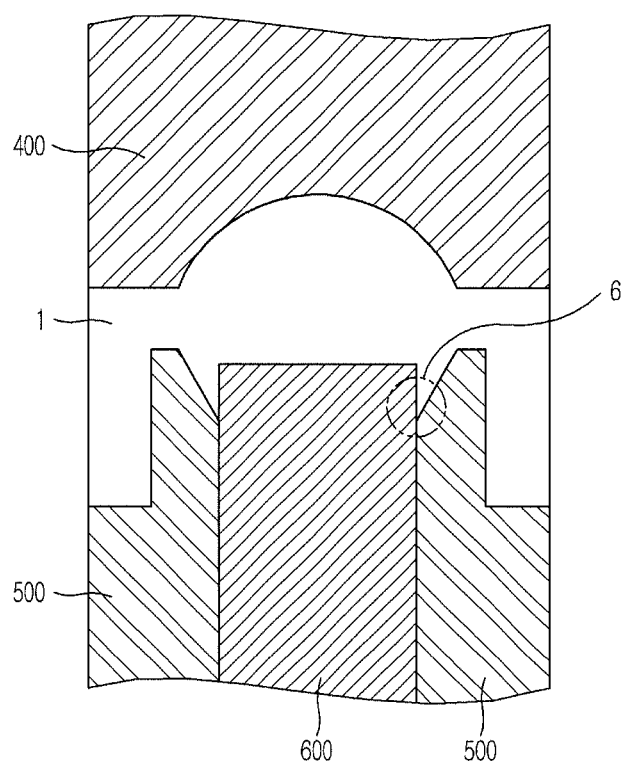
FIG. 9 is a transversal-sectional view illustrating a manufacturing apparatus used in a manufacturing method of an LED flash lens unit in accordance with another embodiment.

FIG. 9 is a transversal-sectional view illustrating the manufacturing apparatus used in the manufacturing method of the LED flash lens unit in accordance with the embodiment of the present invention.

An upper core 400 surrounding the LED flash lens unit 1 is installed on the LED flash lens unit 1, a lower core 500 is installed under the LED flash lens unit 1, and a corrosion core 600 to form the beam scatter device 125 on the lower lens surface of the LED flash lens unit 1 to scatter yellow light is installed between the lower core 500 and the lower lens surface of the LED flash lens unit 1.

Particularly, the lower lens surface of the LED flash lens unit 1 is the transmissive plane 120 of the first lens surface 100.

Further, after a space in which the LED flash lens unit 1 is molded is formed, a lens forming material is injected into the space. Here, in order to exhaust air generated when the LED flash lens unit 1 is formed by injection molding, the corrosion core 600 and the lower core 500 are installed to be separated from each other by at a designated clearance. The designated clearance between the corrosion core 600 and the lower core 500 serves as an air vent.

Further, the molded LED flash lens unit 1 may be pushed by the corrosion core 600, thus being ejected. The corrosion core 600 serves as an ejecting pin. Therefore, flatness of the bottom surface of the LED flash lent unit 1 may be easily managed without any ejecting pin.

Further, in relation to manufacturing of the first lens surface 100, the lower core 500 and the corrosion core 600 are separately manufactured, and thus when the aspheric surface is processed using the lower core 500, the tip 6 of the aspheric surface may be processed and a completion degree in manufacturing of the lens may be raised.

Further, the corrosion core 600 is separately provided to manufacture the beam scatter device 125 to prevent occurrence of yellow bands or yellow rings, and thus damage to the aspheric surface by the lower core 500 may be prevented.

Further, with the manufacturing method of the LED flash lens unit 1 in accordance with the embodiment of the present invention, the respective cores 400, 500 and 600 are easily separated, and thus corrective processing may be easily carried out after the manufacturing process has been completed and the respective cores 400, 500 and 600 may be easily washed.

Moreover, if one of the cores 400, 500 and 600 is damaged, the damaged core may be easily replaced with a new one.

As is apparent from the above description, a LED flash lens unit in accordance with one embodiment of the present invention has a small size, as compared to the conventional xenon stroboscope, and eliminates yellow bands or yellow rings generated during a process of mounting the lens unit on an LED flash and concentrating light, thereby enabling high quality of photographing to be carried out.

Although a few embodiments have been shown and described, it would be appreciated by those skilled in the art that changes may be made in these embodiments without departing from the principles and spirit of the invention, the scope of which is defined in the claims and their equivalents.

What is claimed is:

1. An LED flash lens unit to concentrate LED light emitted from an LED, comprising:
a first lens surface including reflective portions to reflect the LED light if the angle of the LED light passing through the front end of the LED is more than a designated angle, and a transmissive portion to transmit the LED light if the angle of the LED light is not more than the designated angle;
a second lens surface to concentrate the LED light reflected or transmitted by the first lens surface;
a beam scatter device located at the transmissive portion of the first lens surface and provided with at least one form having a designated peak and a designated valley to scatter yellow light from among the LED light; and
a lens support part connecting the first lens surface and the second lens surface to each other and maintaining a designated distance with the LED.

2. The LED flash lens unit according to claim 1, wherein the designated angle is about 140 degrees.

3. The LED flash lens unit according to claim 2, wherein the second lens surface refracts the LED light, reflected or transmitted by the first lens surface to concentrate the LED light.

4. The LED flash lens unit according to claim 1, wherein the beam scatter device is configured such that the at least one form having the designated peak and valley is periodically or aperiodically arranged.

5. The LED flash lens unit according to claim 1, wherein the beam scatter device is in a band shape (ring-shaped) which is installed at a designated portion of the transmissive plane of the first lens surface.

6. The LED flash lens unit according to claim 4, wherein the first lens surface is formed according to a radius and a conic coefficient of the first lens surface, a central thickness of the lens unit, and a depth and a radius of the transmissive portion of the first lens surface.

7. The LED flash lens unit according to claim 6, wherein the second lens surface is formed according to a radius and a conic coefficient of the second lens surface and the central thickness of the lens unit.

8. The LED flash lens unit according to claim 7, wherein the first lens surface or the second lens surface has an aspheric shape.

9. A manufacturing method of an LED flash lens unit to concentrate LED light emitted from an LED, comprising:
installing an upper core surrounding the LED flash lens unit on the LED flash lens unit;
installing a corrosion core, to form a designated beam scatter device scattering yellow light on the lower lens surface of the LED flash lens unit, corresponding to the lower lens surface of the LED flash lens unit;
installing a lower core in a space formed between the LED flash lens unit and the corrosion core; and
injecting a lens forming material into the LED flash lens unit and then molding the LED flash lens unit.

10. The manufacturing method according to claim 9, further comprising separating the corrosion core and the lower core from each other by at a designated clearance so as to exhaust air generated when the LED flash lens unit is formed by injection molding.

11. The manufacturing method according to claim 10, further comprising ejecting the molded LED flash lens unit by pushing the molded LED flash lens unit by the corrosion core.

12. The manufacturing method according to claim 11, wherein the installation of the corrosion core includes installing the corrosion core, to form the designated beam scatter device scattering yellow light on the lower lens surface of the LED flash lens unit by physical corrosion, chemical corrosion or sand blasting, corresponding to the lower lens surface of the LED flash lens unit.

13. An LED flash lens unit manufactured by the method of claim 9.

* * * * *